US005874839A

United States Patent [19]

Wakimoto

[11] Patent Number: 5,874,839

[45] Date of Patent: Feb. 23, 1999

[54] TIMER APPARATUS

[75] Inventor: Akihiko Wakimoto, Hyogo, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 674,749

[22] Filed: Jul. 2, 1996

[30] Foreign Application Priority Data

Feb. 5, 1996 [JP] Japan .................................... 8-018880

[51] Int. Cl.$^6$ .................................................... G01R 29/02

[52] U.S. Cl. ................................ 327/34; 327/26; 327/31; 327/36; 327/48

[58] Field of Search ................................ 327/26, 31, 34, 327/35, 36, 37, 38, 48

[56] References Cited

U.S. PATENT DOCUMENTS 4,926,072 5/1990 Hyodo ...................................... 327/22

*Primary Examiner*—David C. Nelms
*Assistant Examiner*—Andrew Q. Tran
*Attorney, Agent, or Firm*—Leydig, Voit & Mayer, Ltd.

[57] ABSTRACT

In a timer apparatus, the clock controlling circuit thereof outputs a clock signal during a period in which an input signal is significant. The counter thereof counts the number of pulses of the clock signal to generate a count-up signal when the value of count reaches a prescribed value. The initialization circuit thereof outputs an initialization signal when the input is not significant. The clock controlling circuit stops the output of the clock signal when the count-up signal is generated. Thereby, it is prevented to misjudge the detection of an effective pulse width to achieve the effective pulse width though the pulse width of the pulse does not actually reach the effective pulse width actually.

8 Claims, 18 Drawing Sheets

FIG. 17
(PRIOR ART)
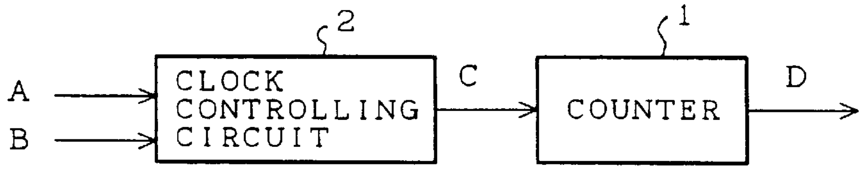
FIG. 18(A)
(PRIOR ART)
FIG. 18(C)
(PRIOR ART)
FIG. 18(Q)
(PRIOR ART)
FIG. 18(D)
(PRIOR ART)
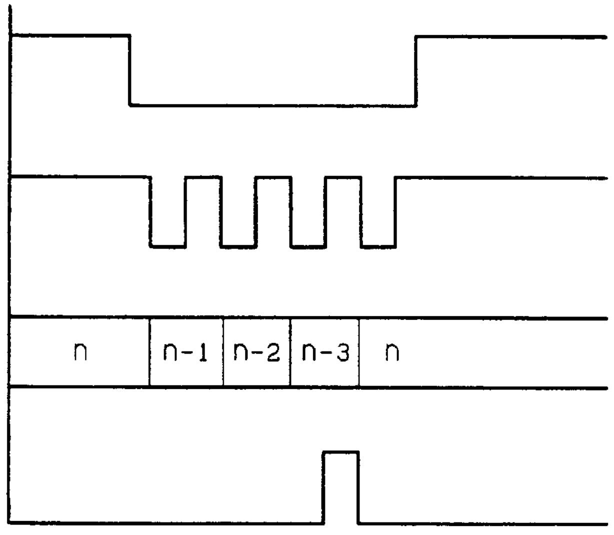

TIMER APPARATUS

BACKGROUND OF THE INVENTION

1. Field of the Invention

The present invention relates to a timer apparatus for detecting a pulse having an effective pulse width.

2. Description of the Prior Art

FIG. 17 is a block diagram showing the structure of a conventional timer apparatus. This timer apparatus is built in an apparatus such as a microcomputer. In the figure, reference numeral 1 denotes a counter counting the number of pulses of a clock signal C. Reference numeral 2 denotes a clock controlling circuit outputting a clock signal shown in FIG. 18(C) while an input signal A is at a low logic level shown in FIG. 18(A). The counter 1 is a down-counter that decreases the value of the count thereof by one by every input pulse.

The operation of the conventional timer apparatus is described below. The clock signal B is always supplied to the clock controlling circuit 2. As shown in FIGS. 18(A), 18(C), 18(Q), and 18(D), while the input signal A is at a low logic level, the clock signal passes through the clock controlling circuit 2 to the counter 1 as the clock signal C. The counter 1 counts the pulses in the clock signal C and when the value of count underflows, the counter 1 generates a count-up signal D of FIG. 18(D). Consequently, when a pulse having a pulse width corresponding to a value n set in the counter 1 as an initial value appears in the input signal A as shown in FIG. 18(A), the count-up signal D is generated. FIG. 18(Q) shows the value of the count of the counter 1, and the reference characters of the other diagrams correspond to the characters of respective signals in the block diagram.

Such a timer apparatus is used for the detection of an effective pulse width. The effective pulse width is defined as a pulse width used as a reference for dealing with an input pulse having a pulse width equal to the effective pulse width or more as an effective signal. Such a timer apparatus is used, for example, the detection of an input by a switch. In that case, the state of on or off of a contact of the switch is input as the input signal A. Consequently, when an on-state continues for a prescribed time or more, the count-up signal D is generated. The prescribed time is defined as a time necessary for the counter 1 to count the value n previously set as an initial value in the counter 1. The count-up signal D is used as, for example, an interrupt signal or a flag setting signal of a central processing unit (CPU). The CPU recognizes a depression of the switch by the occurrence of the interrupt signal or the turn on of a flag. If the on-state of the switch does not continue for a time necessary for the counter 1 to count the value n or more, the CPU regards the state as the occurrence of an on-state for a short time owing to a noise or the like, and concludes that the switch was not depressed.

If a simple counter is employed as the counter 1, a certain problem occurs. As shown in FIGS. 19(A), 19(C), 19(Q), and 19(D), if a pulse having a short pulse width F occurred before the occurrence of a pulse having a prescribed pulse width E, namely the effective pulse width, the value of count of the counter 1 advances during the period of the pulse width F. And then, when the pulse having the pulse width E is input into the counter 1, the counter 1 resumes counting from the value of count thereof at that point of time. As a result, the counter 1 underflows before the end of the period of the pulse width E. That is to say, the count-up signal D is output before the end of the period of the pulse width E. In FIGS. 18(A) and 19(A), a pulse width corresponding to three clocks of the clock signal C is shown as the prescribed pulse width.

Since the conventional timer apparatus is constructed as above, there is a problem that the count-up signal D is output though there is no input of a pulse having the effective pulse width.

SUMMARY OF THE INVENTION

In view of the problem described above, the object of the present invention is to provide a timer apparatus that surely executes the output of a count-up signal by the input of a pulse having an effective pulse width, and further that provides circumstances in which a CPU can process the count-up signal more conveniently.

According to the present invention, for achieving the object described above, there is provided a timer apparatus including an effective pulse width information controlling means for processing a count-up signal of a counter as the information indicating an effective pulse width of an input signal.

The effective pulse width information controlling means of the timer apparatus may include a signal controlling means for processing the first count-up signal during a period in which an input signal is significant as the information indicating the effective pulse width.

The signal controlling means of the timer apparatus may be realized by a clock controlling circuit stopping the output of clock signals when a value a of the counter takes one indicating a prescribed value.

The timer apparatus may further include an effective pulse width information controlling means for processing a count-up signal of the counter as the information indicating the effective pulse width of an input signal, and a count-up frequency measuring circuit counting the frequency of the occurrence of a signal indicating the effective pulse width.

The effective pulse width information controlling means of the timer apparatus may extract a count-up signal at a prescribed frequency of occurrence during a period in which an input signal is significant.

The signal controlling means of the timer apparatus may include a one-shot pulse controlling circuit generating a one-shot pulse beginning at the time of the beginning of a significant period of an input signal and ending at the time of the end of the period or at the time of the generation of an output signal by the counter, and an effective pulse width detecting circuit extracting a count-up signal if the pulse width of the one-shot pulse is a prescribed value or more.

The timer apparatus may further include a continuous pulse counting circuit counting the frequency of the output of a signal by the effective pulse width detecting circuit.

The timer apparatus may comprise an initialization/clock control signal generating circuit initializing the counter thereof at the time of the beginning of a significant period of an input signal, and prohibiting the output of a clock signal by the clock controlling circuit thereof at the time of the occurrence of a count-up signal.

BRIEF DESCRIPTION OF THE DRAWINGS

Further objects and advantages of the present invention can be more fully understood from the following detailed description taken in conjunction with the accompanying drawings in which:

FIG. 17 is a block diagram showing the structure of a conventional timer apparatus;

FIGS. 18(A), 18(C), 18(Q) and 18(D) are timing charts showing an example of the wave forms of signals at respective parts of the timer apparatus shown in FIG. 17.

DETAILED DESCRIPTION OF THE PREFERRED EMBODIMENTS

The preferred embodiments of the present invention will now be described in detail in conjunction with the accompanying drawings.

Embodiment 1

Figure 1:
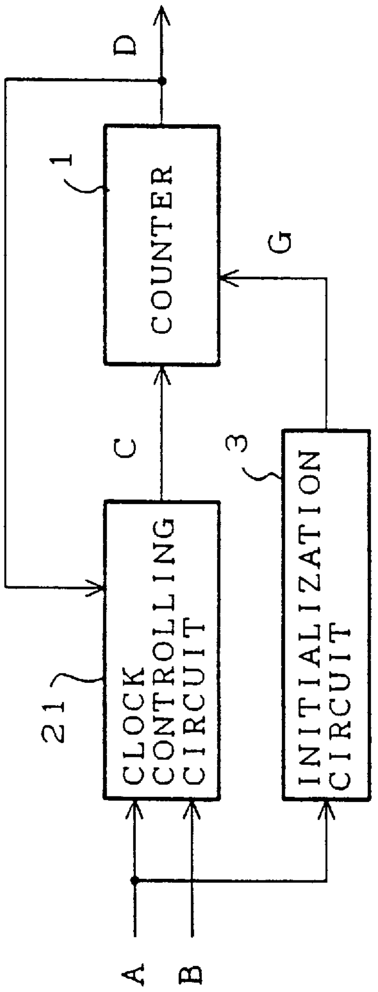
FIG. 1 is a block diagram showing the structure of a timer apparatus according to a first embodiment of the present invention.

FIG. 1 is a block diagram showing the structure of a timer apparatus according to a first embodiment (embodiment 1) of the present invention. In the figure, reference numeral 1 denotes a counter counting the number of pulses in a clock signal C. Reference numeral 21 denotes a clock controlling circuit passing a clock signal B while an input signal A is taking the low level (significant) of logic levels. Reference numeral 3 denotes an initialization circuit generating an initialization signal G for initializing the value of count of the counter 1 when a rise occurs in the input signal A. A down-counter decrementing the count value thereof by one by every input of a pulse is used as the counter 1. The counter 1 freely runs in accordance with the input of a clock. That is to say, the counter 1 takes an initial value n to continue counting at the time of the underflow of the value of count. In the present embodiment, an effective pulse width information controlling means is realized by the clock controlling circuit 21 and the initialization circuit 3. A signal controlling means is realized by the clock controlling circuit 21.

Next, the operation thereof will be described. The clock signal B is always supplied to the clock controlling circuit 21. The clock controlling circuit 21 passes the clock signal B to supply it to the counter 1 as the clock signal C while the input signal A is taking the low level. The counter 1 counts the number of pulses in the clock signal C. The initializing circuit 3 receives the input signal A, and observes the occurrence of a rise of the input signal A.

Figures 2A, 2C, 2D, 2G, 2Q:
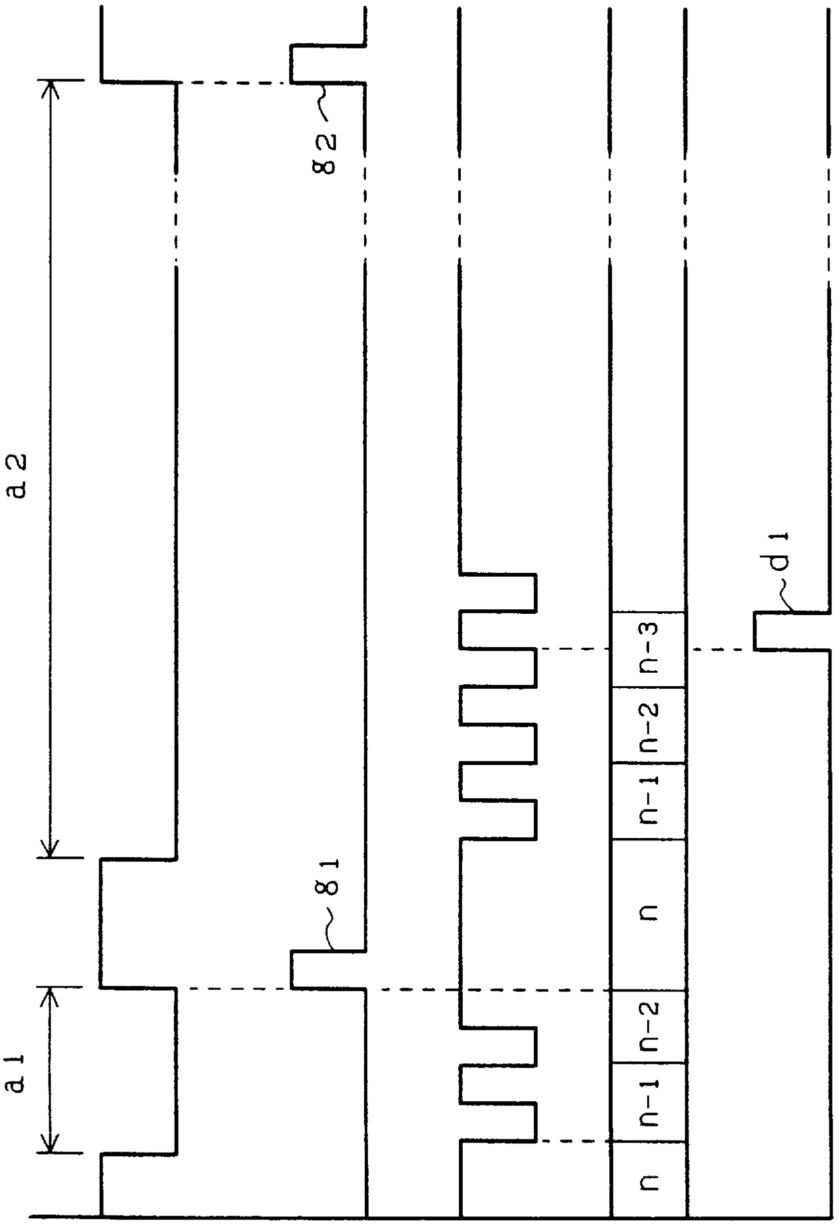
FIGS. 2(A), 2(G), 2(C), 2(Q), 2(D) are timing charts showing an example of the wave forms of signals at respective parts of the timer apparatus shown in FIG. 1.

It is supposed that a pulse having a pulse width a1 shorter than a prescribed pulse width, or the effective pulse width, occurred in the input pulse A and the count value of the counter 1 decreased by two during the pulse width, as shown in FIG. 2(A). But, the initialization circuit 3 generates an initialization signal G at the time of detecting the rise of the pulse having the pulse width a1. In FIG. 2(G), the initialization signal G is denoted by a reference character g1. The counter 1 resets the value of count thereof to the initial value n in response to the initialization signal G. Consequently, there is no case where the counter 1 resumes the count thereof from the value of count that was counted at the last time when the next pulse appears in the input signal A, and the counter 1 always resumes the count thereof from the initial value n. FIG. 2(Q), shows counts values of the counter 1, and the other diagrams illustrate respective signals in the block diagram denoted by the characters corresponding to the characters written on the left side of each diagram. The pulse width corresponding to three clocks of the clock signal C is shown as the prescribed pulse width.

When a pulse having a pulse width a2 longer than the prescribed pulse width is input into the present embodiment, the counter 1 outputs a count-up signal D at the time of passing a period corresponding to the prescribed pulse width. In FIG. 2(D), the count-up signal D is denoted by a reference character d1. The count-up signal D is also input into the clock controlling circuit 21. When the clock controlling circuit 21 receives the count-up signal D, the circuit 21 prohibits the clock signal B from passing it even if the input signal A takes the low level then. Consequently, the count-up signal D is not output after that during the period of the pulse width a2. The clock controlling circuit 21 removes the prohibition of the passing of the clock signal B when the next fall appears in the input signal A.

Thus, it is prevented that the count-up signal D is output before the period corresponding to the prescribed pulse width has passed. Besides, the count-up signal D is not output after the period corresponding to the prescribed pulse width has passed, even if a pulse having a pulse width equal to the prescribed pulse width or more is input. Thereby, there is obtained the advantage that the amount of processes of a CPU is decreased. For example, supposing that the pulse width a2 is double the prescribed pulse width or more, the count-up signal-D is output twice or more if the passing of the clock signal B is not prohibited. If the count-up signal D is input into a CPU as an interrupt signal or a flag setting signal, the CPU executes a process to distinguish a first time count-up signal D from a second time count-up signal D.

As an example, a description will be given to the case where the input signal A indicates the state of on or off of a contact of a switch. If the switch is depressed for a long time, a pulse having a long pulse width appears in the input signal A. But, since the switch is depressed only once, it is desirable that the count-up signal D appears only once. If the embodiment principle of the first is not applied, there is a probability that the count-up signal is generated twice or more. If the count-up signal is generated twice or more, the CPU must execute a process for distinguishing whether the switch is depressed only once, or twice or more. According to the first embodiment, such a load on the CPU is decreased.

Embodiment 2.

Figure 3:
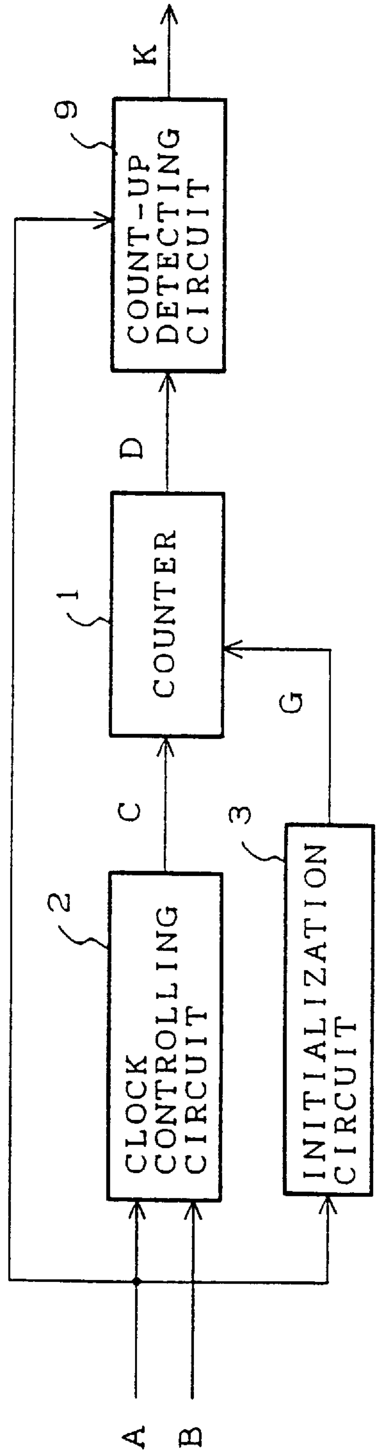
FIG. 3 is a block diagram showing the structure of a timer apparatus according to a second embodiment of the present invention.

FIG. 3 is a block diagram showing the structure of a timer apparatus according to a second embodiment (embodiment 2) of the present invention. In the figure, reference numeral 9 denotes a count-up detecting circuit generating an output signal K on the basis of an input signal A and a count-up signal D. The other elements comprising the timer apparatus are the same as those in the first embodiment or those shown in FIG. 17. In this case, an effective pulse width information controlling means is realized by the initialization circuit 3 and the count-up detecting circuit 9. A signal controlling means is realized by the count-up detecting circuit 9.

Figures 4A, 4C, 4D, 4G, 4K, 4Q:
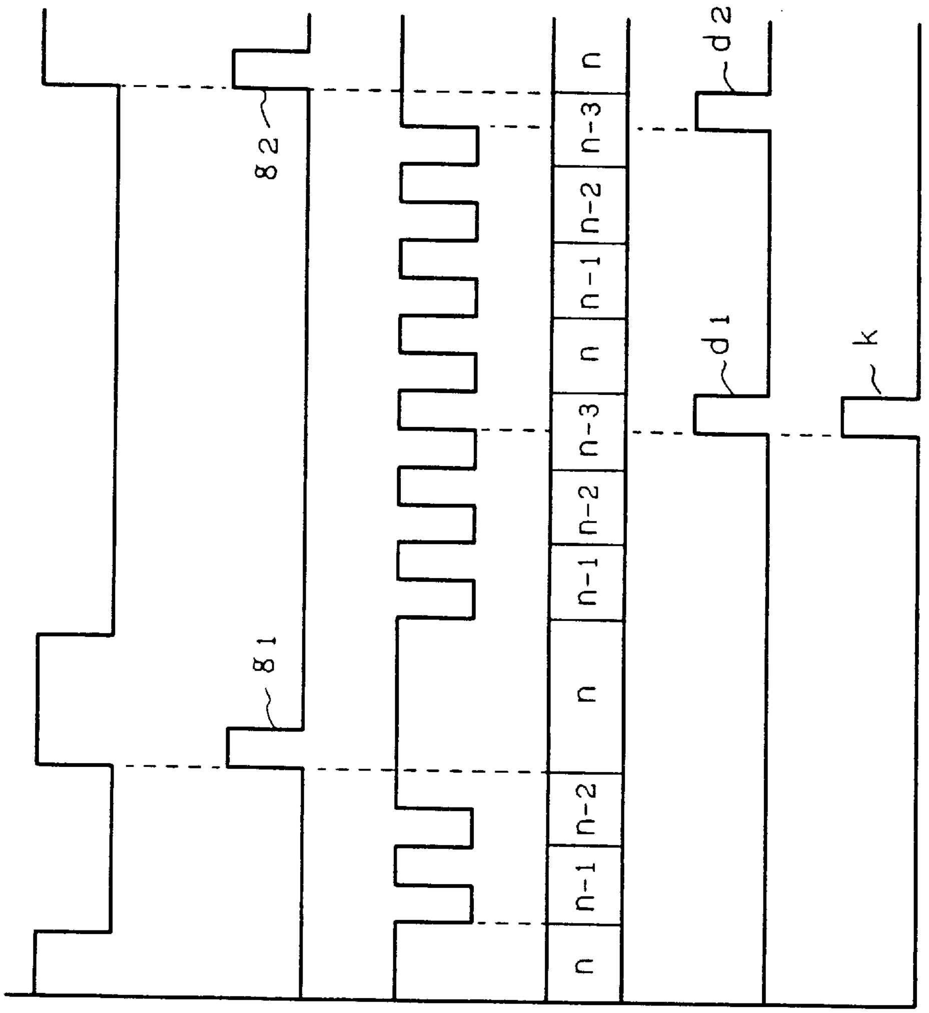
FIGS. 4(A), 4(G), 4(C), 4(Q), 4(D), and 4(K) are timing charts showing an example of the wave forms of signals at respective parts of the timer apparatus shown in FIG. 3.

Next, the operation thereof will be described. The operation is identical to the first embodiment in that, even if a pulse having a pulse width shorter than a prescribed pulse width is input, the counter 1 is initialized at the time of the rise of the pulse. But, since the counter 1 is one that freely runs according to the input of clocks, and since the count-up signal D is not input into the clock controlling circuit 2, then if a pulse having a pulse width double the prescribed pulse width or more appears in the input signal A, the counter 1 outputs the count-up signal D twice or more. In FIG. 4(D), the count-up signal D is denoted by reference characters d1 and d2. The count-up detecting circuit 9 outputs an output signal K when a first time count-up signal D (d1) is generated after the fall of the input signal A. That is to say, the occurrence of the output signal K signifies the occurrence of the first time count-up signal D. In FIG. 4(K), the output signal K is denoted by a reference character k.

The counter 1 later outputs a second time count-up signal D (d2) as shown in FIG. 4(D). But, the count-up detecting circuit 9 refuses the second time count-up signal D and ones after that while the input signal A are at the low level. Consequently, if a pulse appears in the input signal A, the output signal K is output once at the most. The count-up detecting circuit 9 is reset to the initial state thereof when a rise occurs in the input signal A.

According to the second embodiment, also, it is prevented that the count-up signal D is output before the end of a period corresponding to a prescribed pulse width. Furthermore, even if a pulse having a pulse width equal to the prescribed pulse width or more is input, the output signal K is not output after the period corresponding to the prescribed pulse width has passed. Thereby, if the output signal K is supplied to a CPU as an interrupt signal or a flag setting signal, there is obtained the advantage that the processes of the CPU is decreased.

It may be applicable to compose the structure of the invention so that the count-up signal D, as well as the output signal K, is output to the CPU side as an interrupt signal or a flag setting signal. In that case, the CPU is provided with the count-up signal D that is generated at every point of time when the input signal A has been at the low level for the prescribed time, together with the output signal K that signifies the point of time of the first time occurrence of the count-up signal D, namely signifies the point of time when the input signal A has been at the low level for the prescribed time. Accordingly, the CPU can execute processes such as detecting the time of the depression of a switch on the basis of the frequency of the occurrence of the count-up signal D as well as detecting the depression of the switch surely. The CPU can also execute such a process as detecting the depression of the switch more surely on the basis of the frequency of the occurrence of the count-up signal D.

Embodiment 3

Figure 5:
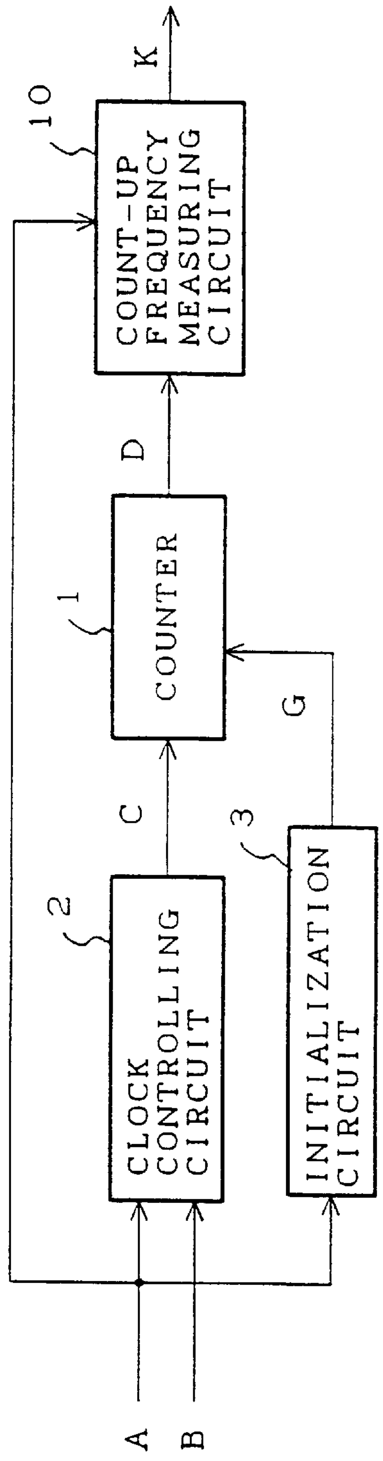
FIG. 5 is a block diagram showing the structure of a timer apparatus according to a third embodiment of the present invention.

FIG. 5 is a block diagram showing the structure of a timer apparatus according to a third embodiment (embodiment 3) of the present invention. In the figure, reference numeral 10 denotes a count-up frequency measuring circuit counting the frequency of the occurrence of the count-up signal D from the counter 1. The other composing elements are the same as those of the first embodiment or those shown in FIG. 17. In this case, an effective pulse width information controlling means is realized by the initialization circuit 3 and the count-up frequency measuring circuit 10.

Figures 6A, 6C, 6D, 6G, 6K, 6Q:
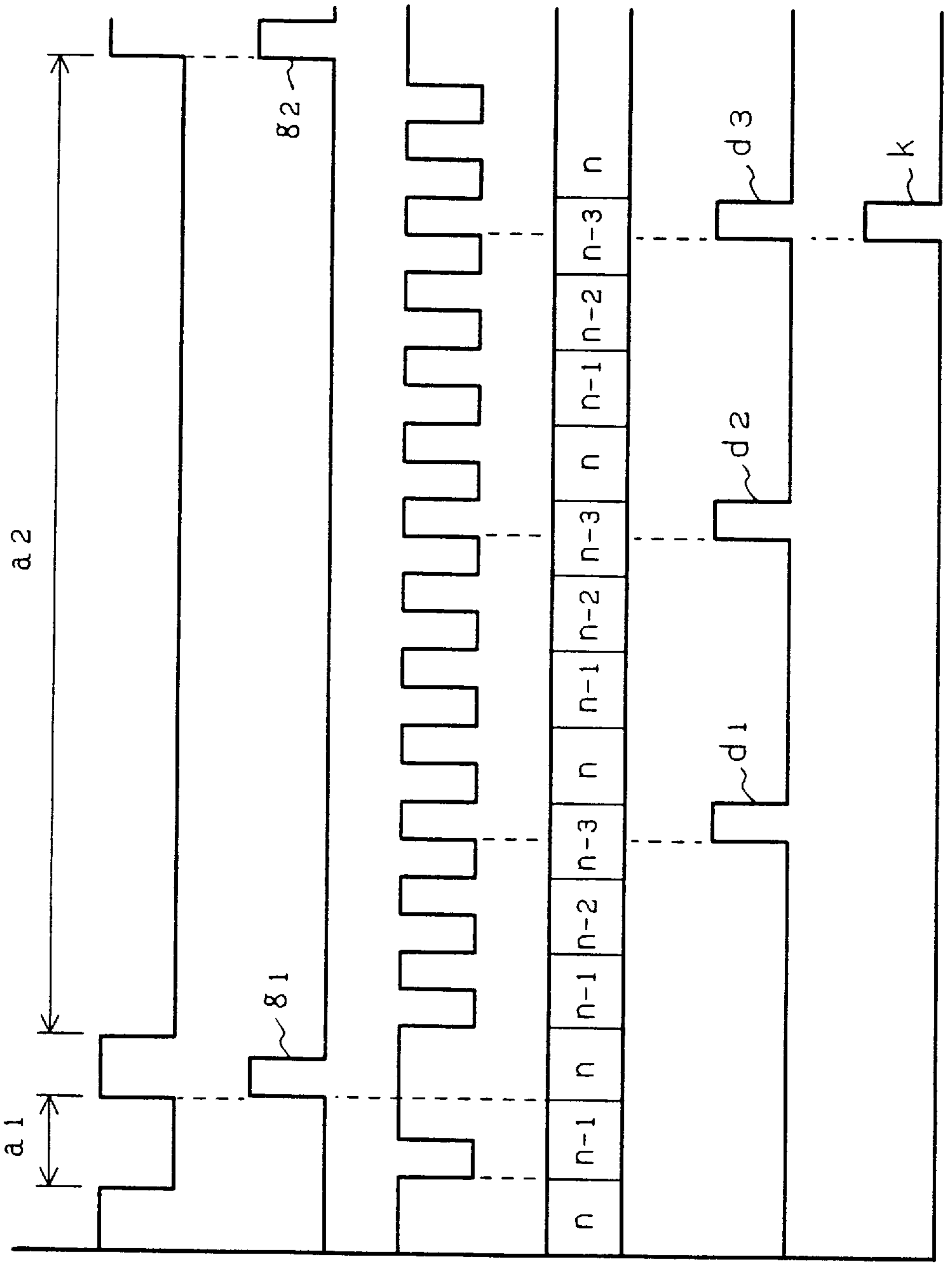
FIGS. 6(A), 6(G), 6(C), 6(Q), 6(D) and 6(K) are timing charts showing an example of the wave forms of signals at respective parts of the timer apparatus shown in FIG. 5.

Next, the operation thereof will be described. It is identical to the first and second embodiments in that the counter 1 is initialized at the time of the rise of an input pulse having a pulse width a1 shorter than a prescribed pulse width. The counter 1 generates a count-up signal D at every occurrence of underflow while the input signal A is at the low level. In FIG. 6(D), the count-up signal D is denoted by reference characters d1, d2 and d3.

A prescribed frequency is previously set in the count-up frequency measuring circuit 10. The count-up frequency measuring circuit 10 counts the frequency of the occurrence of the count-up signal D to output an output signal K when the frequency of the occurrence reaches the prescribed frequency while the input signal A is at the low level. FIG. 6 (D) illustrates the case where the prescribed frequency is three. And, FIG. 6 (A) also illustrates the case where a pulse having a pulse width a2 longer than the pulse width corresponding to the maximum value of count of the counter 1 is input.

The third embodiment is effective especially for the case where the number of bits of the counter 1 is short for the pulse width which an operator wants to detect. That is to say, the third embodiment is effective for the case where an operator wants to detect a pulse width longer than the pulse width corresponding to the maximum count value of the counter 1 as the prescribed pulse width. In this case, the prescribed pulse width, or the effective pulse width, is one corresponding to the value of count of (the maximum value of count of the counter 1)~3. But, an arbitrary prescribed frequency can be set in the count-up frequency measuring circuit 10. That is to say, an arbitrary pulse width can be detected as a prescribed pulse width by taking the maximum count value of the counter 1 as a unit.

The output signal K is used as, for example, an interrupt signal or a flag setting signal of a CPU. By the output signal K, the CPU can immediately recognize that a pulse signal having a pulse width equal to the prescribed pulse width or more was input. If there is no count-up frequency measuring circuit 10, the process of count must be executed by software. The structure of the present invention may be composed so that the count-up signal D, as well as the output signal K, is output to the CPU side as an interrupt signal or a flag setting signal.

In this case, the description was given to the case where the initial value of the counter 1 was set as the maximum value, but a value smaller than the maximum count value may be set as the initial value. Moreover, if the initial value of the counter 1 and the prescribed frequency in the count-up frequency measuring circuit 10 are suitably set, a prescribed pulse width having an arbitrary width can be detected.

Embodiment 4

Figure 7:
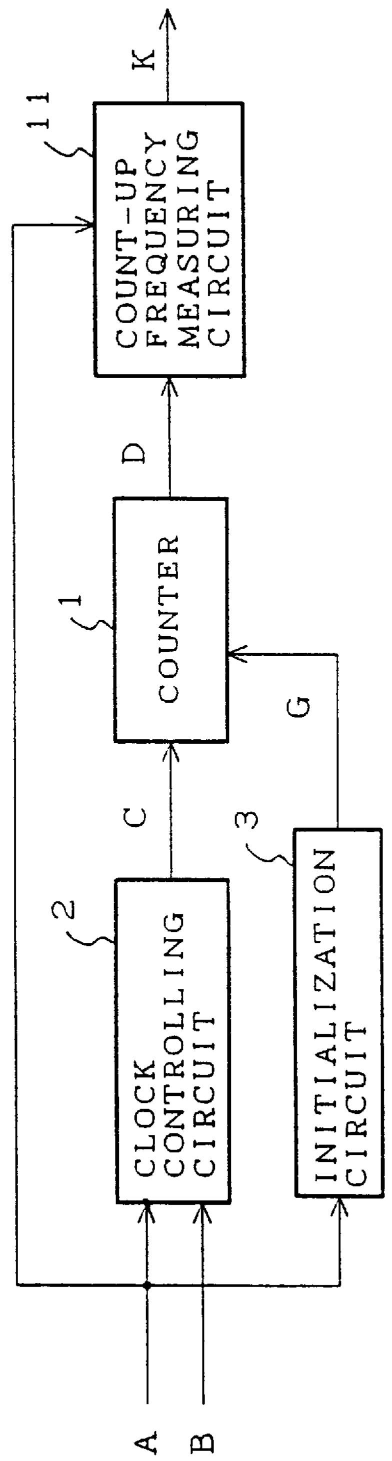
FIG. 7 is a block diagram showing the structure of a timer apparatus according to a fourth embodiment of the present invention.

FIG. 7 is a block diagram showing the structure of a timer apparatus according to a fourth embodiment (embodiment 4) of the present invention. In the figure, reference numeral 11 denotes a count-up frequency measuring circuit counting the frequency of the occurrence of the count-up signal D from the counter 1. The other elements comprising the timer apparatus are the same as those of the first embodiment or those shown in FIG. 17. In this case, an effective pulse width information controlling means is realized by the initialization circuit 3 and the count-up frequency measuring circuit 11. A signal controlling means is realized by the count-up frequency measuring circuit 11.

Figures 8A, 8C, 8D, 8G, 8K, 8Q:
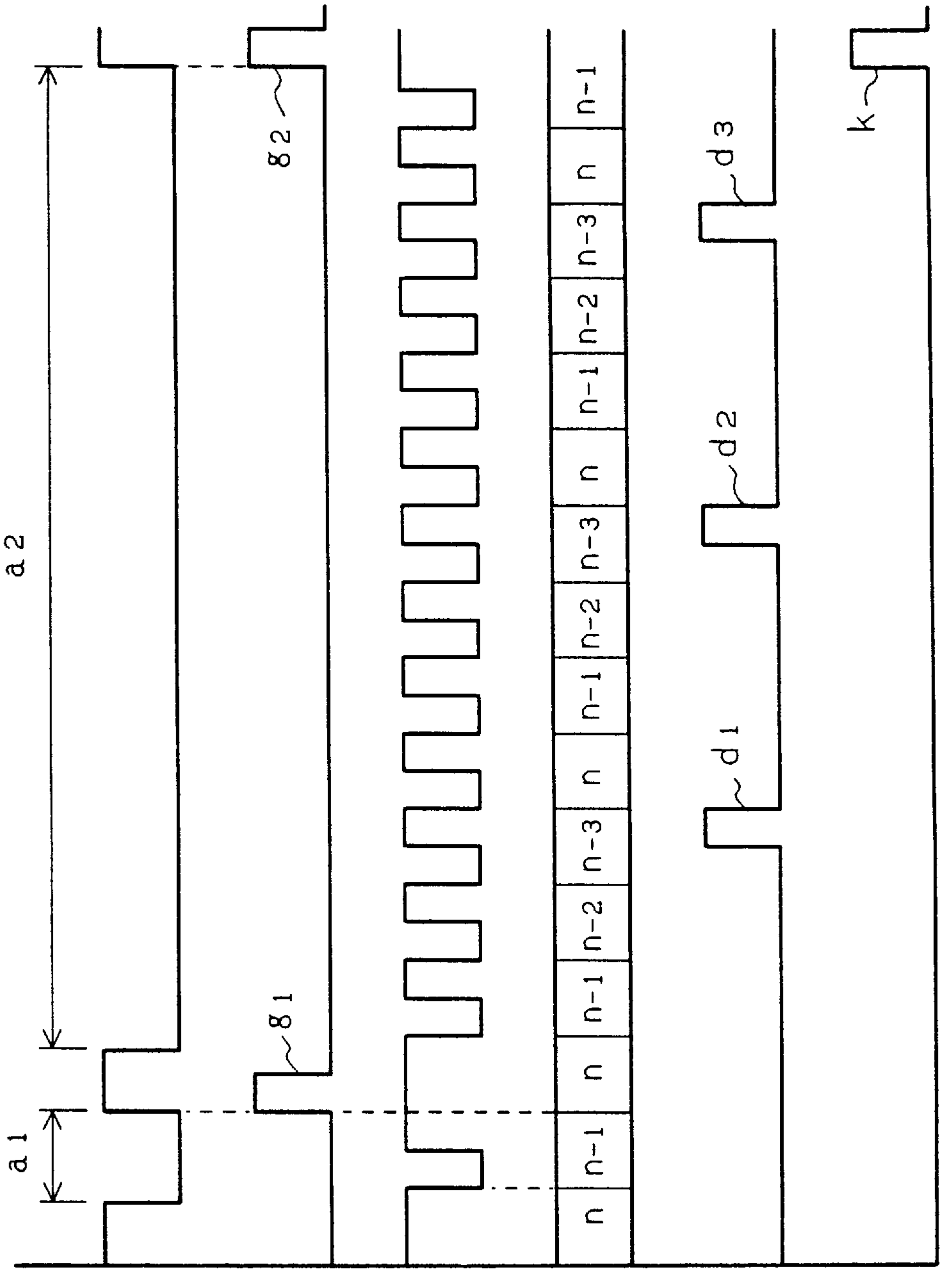
FIGS. 8(A), 8(G), 8(C), 8(Q), 8(D) and 8(K) are timing charts showing an example of the wave forms of signals at respective parts of the timer apparatus shown in FIG. 7.

Next, the operation thereof will be described. It is identical to the first, second, and third embodiments in that the counter 1 is initialized at the time of the rise of an input pulse having a pulse width a1 shorter than a prescribed pulse width. The counter 1 generates a count-up signal D at the time of every occurrence of underflow. In FIG. 8(D), the count-up signal D is denoted by reference characters d1, d2 and d3. The count-up frequency measuring circuit 11 counts the frequency of the occurrence of the count-up signal D. Then, the count-up frequency measuring circuit 11 outputs the count value at the time of the rise of the input signal A as the output signal K.

According to the fourth embodiment, the pulse width of an input pulse can easily be measured even if the number of bits of the counter 1 is short for the pulse width of the input pulse. That is to say, if the output signal K is supplied to a CPU as an interrupt signal or a flag setting signal, the CPU can immediately recognize the pulse width on the basis of the output signal K.

Embodiment 5

Figure 9:
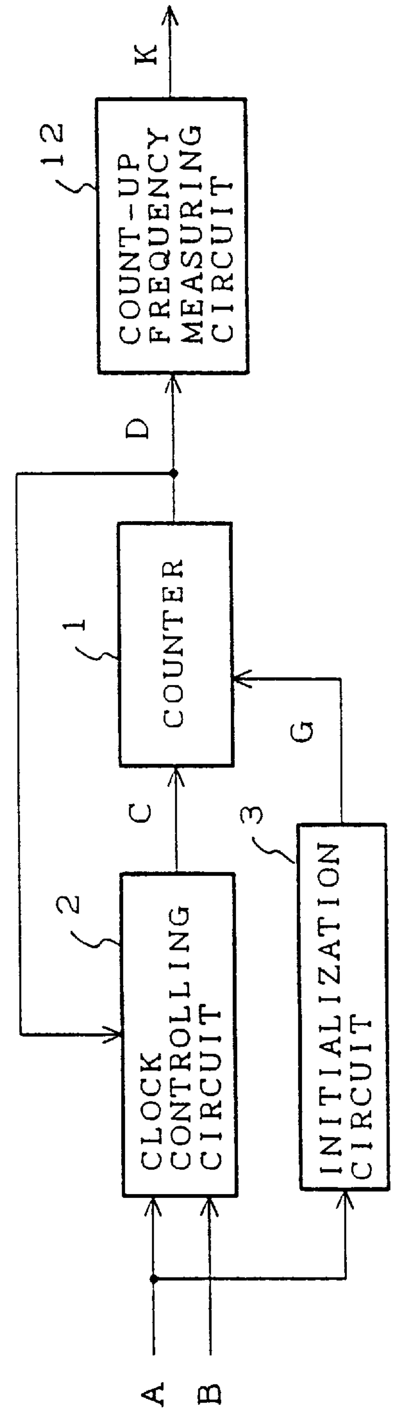
FIG. 9 is a block diagram showing the structure of a timer apparatus according to a fifth embodiment of the present invention.

FIG. 9 is a block diagram showing the structure of a timer apparatus according to a fifth embodiment (embodiment 5) of the present invention. In the figure, reference numeral 12 denotes a count-up frequency measuring circuit counting the frequency of the occurrence of the count-up signal D from the counter 1. In this case, the input signal A is not supplied to the count-up frequency measuring circuit 12, which is different from the third embodiment. The other elements comprising the timer apparatus are the same as those of the first embodiment.

Next, the operation thereof will be described. It is identical to the first through fourth embodiments in that the counter 1 is initialized at the time of the rise of an input pulse having a pulse width a1 shorter than a prescribed pulse width. The counter 1 generates the count-up signal D at the time of every occurrence of underflow. Similarly in the case of the first embodiment, the clock controlling circuit 2 stops the output of the clock signal C when the count-up signal D is generated.

Figures 10A, 10C, 10D, 10G, 10K, 10Q:
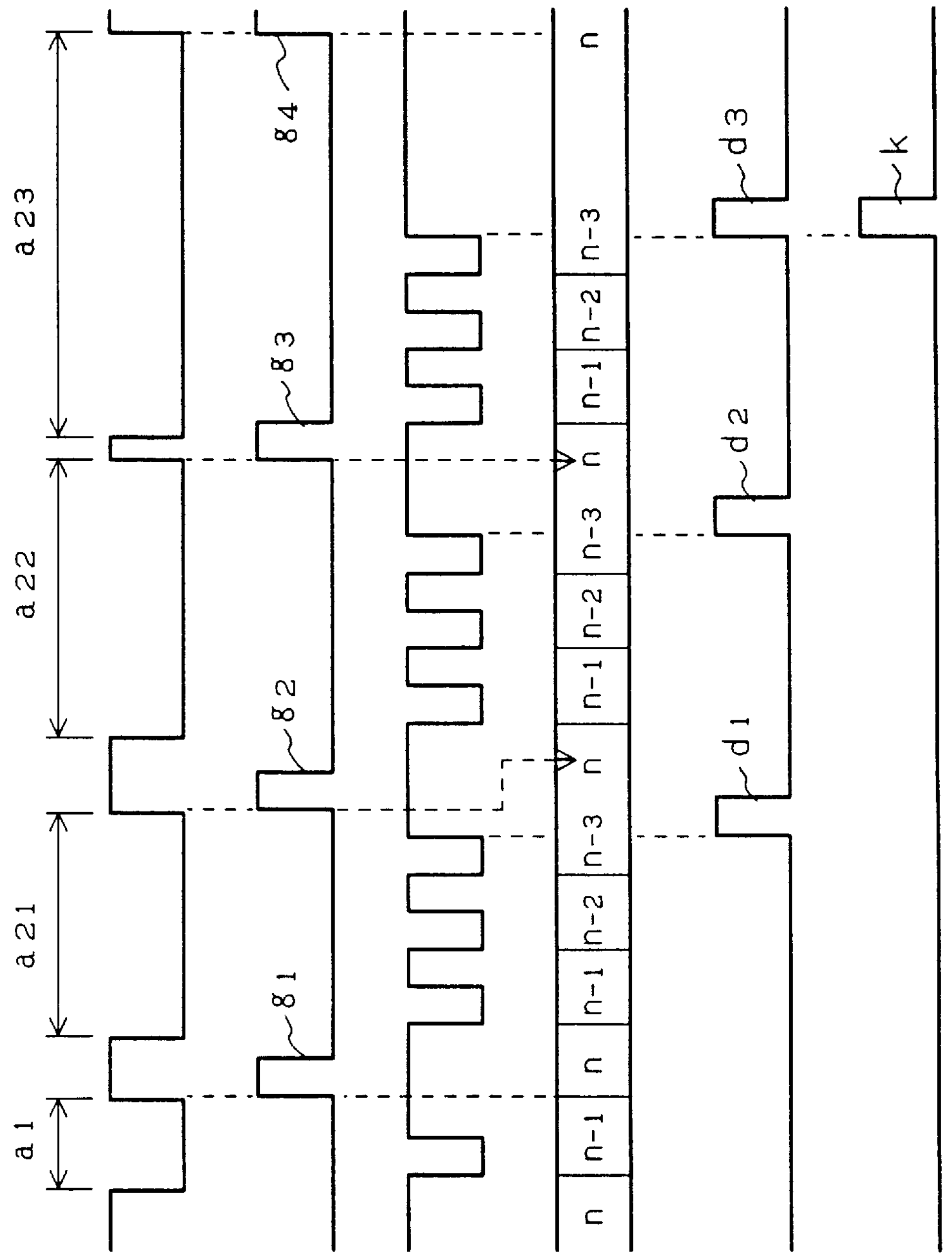
FIGS. 10(A), 10(G), 10(C), 10(Q), 10(D) and 10(K) are timing charts showing an example of the wave forms of signals at respective parts of the timer apparatus shown in FIG. 9.

FIG. 10(A) illustrates the input of respective pulses having pulse widths a21, a22 and a23 longer than the prescribed pulse width respectively. The count-up signal D corresponding to each pulse is denoted by reference characters d1, d2 and d3 respectively. A prescribed frequency is previously set in the count-up frequency measuring circuit 12. The count-up frequency measuring circuit 12 counts the frequency of the occurrence of the count-up signal D to output an output signal K when the frequency of occurrence gets to the prescribed frequency. FIG. 10 (D) shows the case where the prescribed frequency is three. The count-up frequency measuring circuit 12 continues counting the frequency of occurrence whether the input signal A continues at the low level or not.

The fifth embodiment is especially effective for the case of the detection of whether pulses having pulse widths equal to a prescribed pulse width or more are input by a prescribed frequency or not. The output signal K is used as, for example, an interrupt signal or a flag setting signal of a CPU. By the output signal K, the CPU can immediately recognize that pulses having pulse widths equal to a prescribed pulse width or more were input by a prescribed frequency. If the input signal A indicates the state of on or off of a contact of a switch, the CPU can immediately recognize that the effective depressions of the switch were made by the prescribed frequency.

If there is no count-up frequency measuring circuit 10, the process of count must be executed by software. The structure of the present invention may be arranged so that the count-up signal D, as well as the output signal K, are output to the CPU side as an interrupt signal or a flag setting signal.

Embodiment 6

Figure 11:
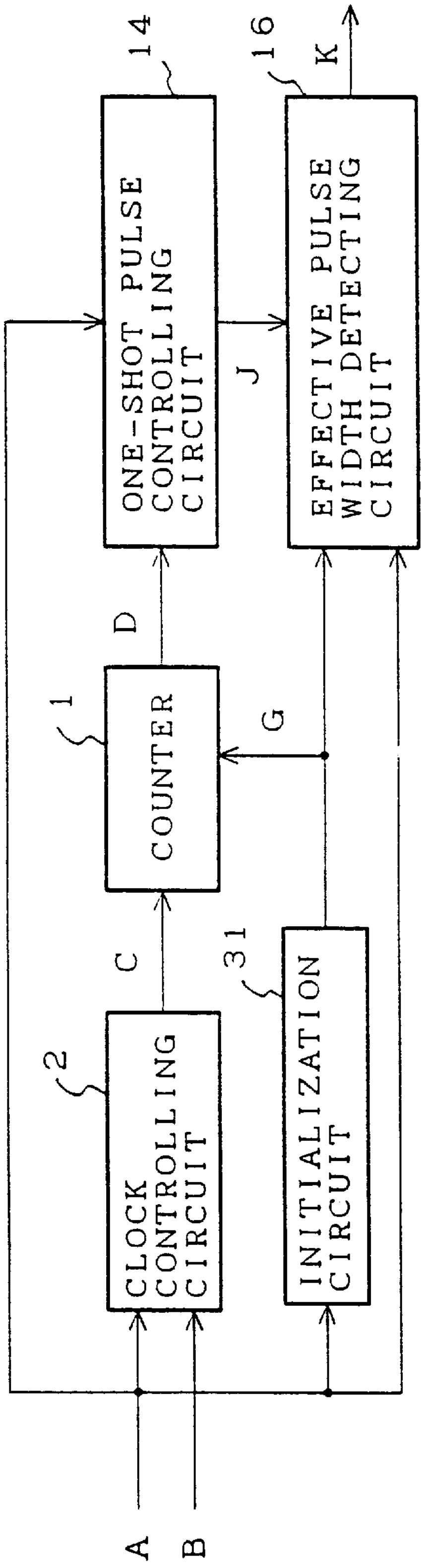
FIG. 11 is a block diagram showing the structure of a timer apparatus according to a sixth embodiment of the present invention.

FIG. 11 is a block diagram showing the structure of a timer apparatus according to a sixth embodiment (embodiment 6) of the present invention. In the figure, reference numeral 14 denotes a one-shot pulse controlling circuit generating a one-shot pulse J that rises in accordance with a fall of the input signal A and falls in accordance with a rise of the input signal A or the occurrence of a count-up signal D. Reference numeral 16 denotes an effective pulse width detecting circuit judging whether a fall of the one-shot pulse J was caused by a count-up of the counter 1 or not. Reference numeral 31 denotes an initialization circuit outputting an initialization signal G in accordance with a fall of the input signal A. The other elements comprising the timer apparatus are the same as those in the first embodiment or those shown in FIG. 17. In this case, an effective pulse width information controlling means is realized by the initialization circuit 31, the one-shot pulse controlling circuit 14 and the effective pulse width detecting circuit 16. A signal controlling means is realized by the one-shot pulse controlling circuit 14 and the effective pulse width detecting circuit 16.

Next, the operation thereof will be described. The clock controlling circuit 2 passes the clock signal B to supply it to the counter 1 as the clock signal C while the input signal A is at the low level. The counter 1 counts the number of pulses in the clock signal C. The initialization circuit 31 receives the input signal A and observes the occurrence of a fall of the input signal A.

Figures 12A, 12C, 12D, 12G, 12J, 12K, 12Q:
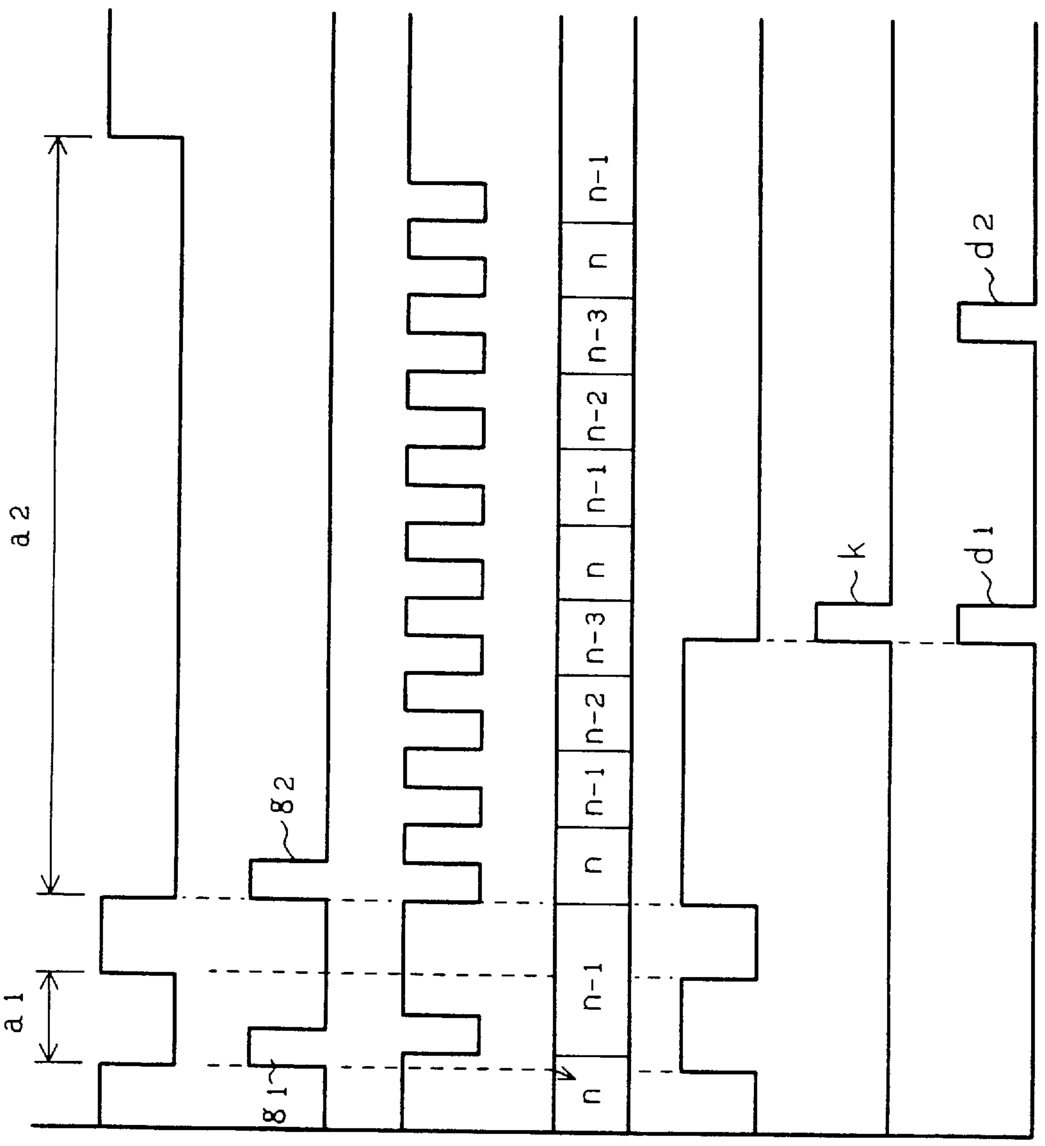
FIGS. 12(A), 12(G), 12(C), 12(Q), 12(J), 12(K), and 12(D) are timing charts showing an example of the wave forms of signals at respective parts of the timer apparatus shown in FIG. 11.

As shown in FIG. 12(A), it is assumed that a pulse having a pulse width a1 shorter than a prescribed pulse width appears in the input signal A and the count value of the counter 1 decreased by one. But, the initialization circuit 31 generates an initialization signal G when the circuit 31 detects a fall of the next pulse. In FIG. 12(G), the initialization signal in this case is denoted a reference character g2. The counter 1 resets the value of count thereof to an initial value n in response to the initialization signal G. Consequently, according to the sixth embodiment, the counter 1 always resumes the count thereof from the initial value n instead of resuming the count thereof from the count value that was counted at the last time, when the next pulse appears in the input signal A.

The one-shot pulse controlling circuit 14 is realized by, for example, a flip-flop. If the one-shot pulse controlling circuit 14 is realized by the flip-flop, the circuit 14 is set by a fall that occurred in the input signal A and is reset by a rise that occurred in the input signal A or by the occurrence of a count-up signal D. Consequently, if a pulse having a pulse width a1 shorter than the prescribed pulse width is generated, as shown in FIG. 12(A), the circuit 14 is set by the fall of the pulse and is reset by the rise of the pulse. Then, a one-shot pulse J having a pulse width corresponding to the pulse width a1 shorter than the prescribed pulse width is output.

The effective pulse width detecting circuit 16 judges whether the fall of a one-shot pulse J is caused by a count-up of the counter 1 or not. If the input signal A continues at the low level, it can be identified that the one-shot pulse J fell owing to a count-up of the counter 1. In this case where a pulse having a pulse width a1 shorter than the prescribed pulse width was generated, since the input signal A returned to the high level of logic levels, it is judged that the one-shot pulse J did not fall owing to a count-up of the counter 1. If the effective pulse width detecting circuit 16 judged so, the circuit 16 does not output the output signal K.

When a pulse having the pulse width a2 longer than the prescribed pulse width is generated, the one-shot pulse controlling circuit 14 resumes the output of the one-shot pulse J in accordance with a fall of the generated pulse. When the counter 1 underflows, the counter 1 outputs a count-up signal D. The one-shot pulse controlling circuit 14 makes the one-shot pulse J fall in accordance with the occurrence of the count-up signal D. Since the input signal A continues at the low level, the effective pulse width detecting circuit 16 judges that the one-shot pulse J fell owing to a count-up of the counter 1. Accordingly, the effective pulse width detecting circuit 16 outputs an output signal K as shown in FIG. 12(K).

If the pulse width a2 is double the prescribed pulse width or more, the counter 1 again underflows to generate a count-up signal D (d2). But, since the one-shot pulse J is not output at that time, the output signal K is not output.

As described above, according to the sixth embodiment, it is prevented that the count-up signal D is output before a period corresponding to the prescribed pulse width has passed. Moreover, the output signal K is not output after the period corresponding to the prescribed pulse width has passed, even if a pulse having a pulse width equal to the prescribed pulse width or more is input. Consequently, there is obtained the advantage that a CPU can decrease the load thereof for processing. For instance, if the output signal K is input to the CPU as an interrupt signal or a flag setting signal by the output signal K can the CPU can immediately recognize that a pulse having a pulse width equal to the prescribed pulse width or more was input. The structure of the present invention may be constructed so that the count-up signal D, as well as the output signal K, is output to the CPU side as an interrupt signal or a flag setting signal.

The description, here, was given with respect to the case where the one-shot pulse J having the high level was used, but the one-shot pulse J may be one having the low level.

Embodiment 7

Figure 13:
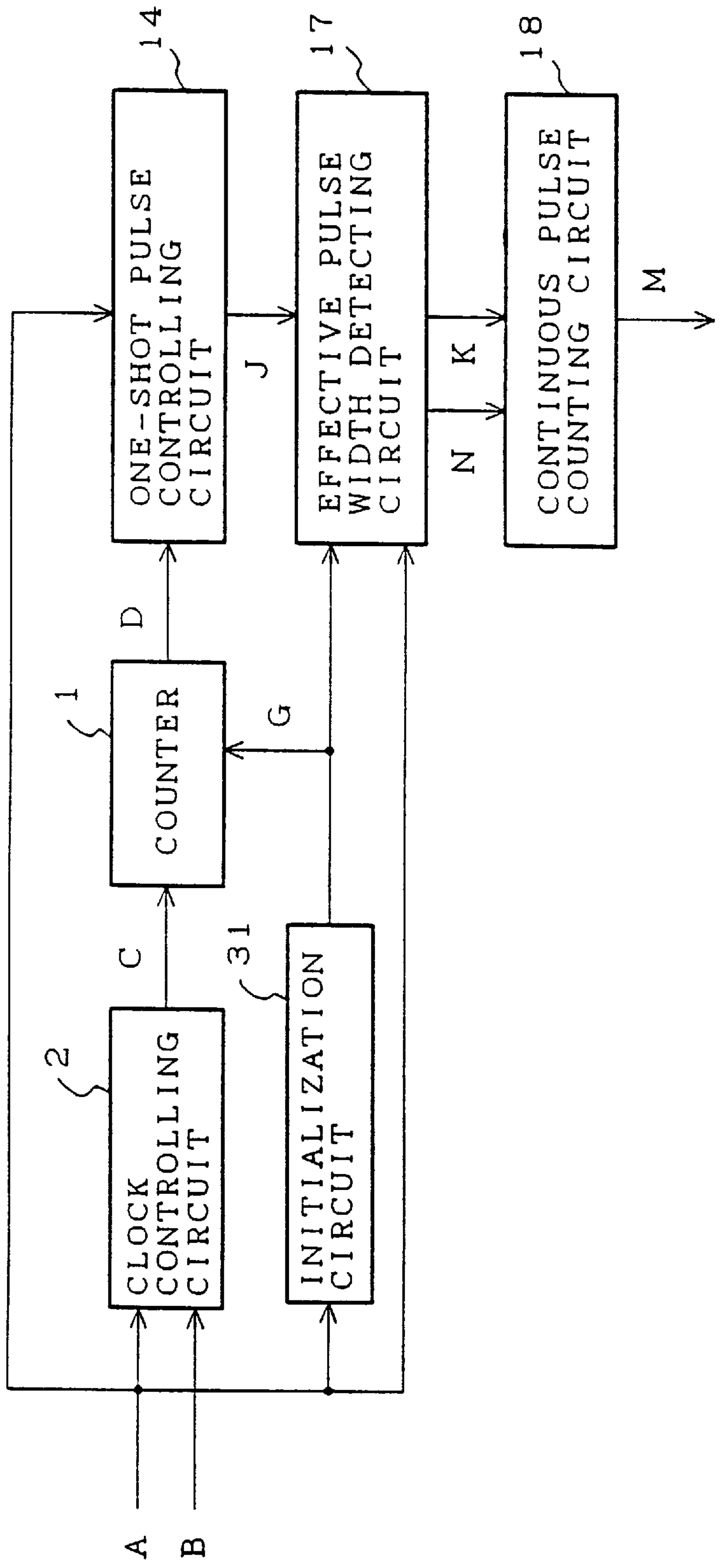
FIG. 13 is a block diagram showing the structure of a timer apparatus according to a seventh embodiment of the present invention.

FIG. 13 is a block diagram showing the structure of a timer apparatus according to a seventh embodiment (embodiment 7) of the present invention. In the figure, reference numeral 17 denotes an effective pulse width detecting circuit determining whether a fall of the one-shot pulse J was caused by a count-up of the counter 1 or not, and generating a clear signal N if the one-shot pulse J did not fall owing to the count-up of the one-shot pulse J. Reference numeral 18 denotes a continuous pulse counting circuit counting the frequency of the output of the output signal K. The other elements comprising the timer apparatus are the same as those of the sixth embodiment. In this case, an effective pulse width information controlling means is realized by the initialization circuit 31, the one-shot pulse controlling circuit 14 and the effective pulse width detecting circuit 17. A signal controlling means is realized by the one-shot pulse controlling circuit 14 and the effective pulse width detecting circuit 17.

Next, the operation thereof will be described. The clock controlling circuit 2 passes the clock signal B to supply to the counter 1 as the clock signal C while the input signal A is at the low level. The counter 1 counts the number of pulses in the clock signal C. The initialization circuit 31 receives the input signal A and observes the occurrence of a fall in the input signal A. It is identical to the sixth embodiment that, even if a pulse having a pulse width a1 shorter than a prescribed pulse width is input, the counter 1 is initialized at the time of a fall of the next pulse.

Figures 14A, 14C, 14G, 14J, 14K, 14M, 14N, 14Q:
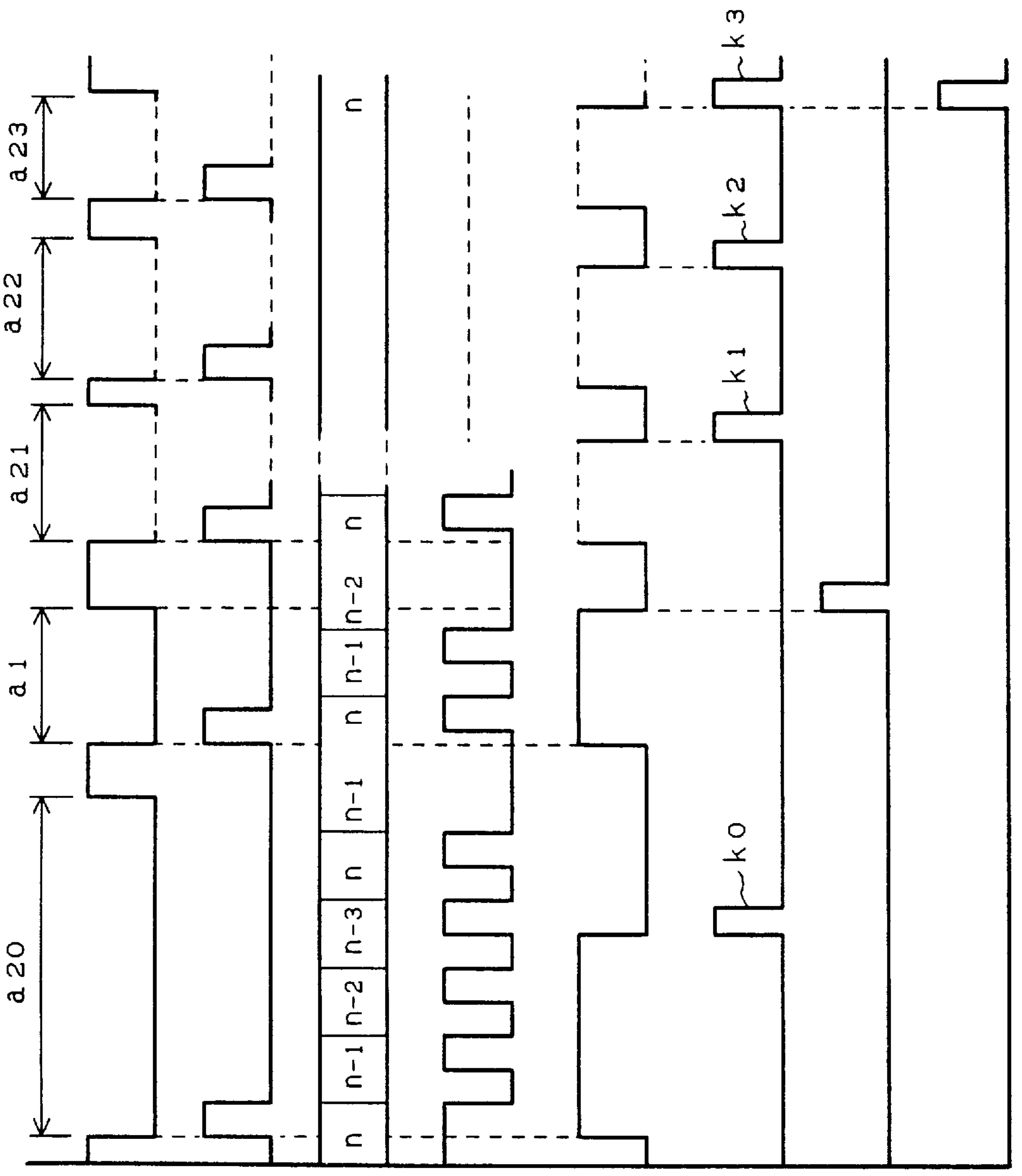
FIGS. 14(A), 14(G), 14(Q), 14(C), 14(J), 14(K), 14(N), and 14(M) are timing charts showing an example of the wave forms of signals at respective parts of the timer apparatus shown in FIG. 13.

When the counter 1 underflows, the counter 1 outputs a count-up signal D. The one-shot pulse controlling circuit 14 makes the one-shot pulse J fall in response to the occurrence of the count-up signal D. The effective pulse width detecting circuit 17 operates similarly to the effective pulse width detecting circuit 16 in the sixth embodiment. Namely, the effective pulse width detecting circuit 17 outputs an output signal K when the circuit 17 determines that the one-shot pulse J fell owing to a count-up of the counter 1. For example, the circuit 17 outputs the output signal K (kO) when a pulse having a pulse width a20 longer than a prescribed pulse width is input, as shown in FIG. 14(A).

The effective pulse width detecting circuit 17 generates a clear signal N when the circuit 17 determines that the one-shot pulse J did not fall owing to a count up of the counter 1. The clear signal N is supplied to the continuous pulse counting circuit 18. A prescribed frequency is set in the circuit 18. The circuit 18 counts the frequency of the occurrence of the output signal K to output an output signal M when the frequency of occurrence reaches the prescribed frequency. But, the count value of the circuit 18 is cleared by the clear signal N.

Consequently, the count value of the continuous pulse counting circuit 18 is initialized when a pulse having a pulse width a1 shorter than the prescribed pulse width is input, even if the count value of the circuit 18 advanced during the period in which the pulse having the pulse width a20 was input. The reason is that the effective pulse width detecting circuit 17 generates the clear signal N. If pulses respectively having pulse widths a21, a22 and a23 longer than the prescribed pulse width are continuously input, the effective pulse width detecting circuit 17 continuously outputs the output signals K (k1, k2, k3) without generating the clear signal N. Thereby, the count value of the continuous pulse counting circuit 18 advances. When the count value reaches the value set as the prescribed frequency, the circuit 18 generates an output signal M. FIG. 14(K) illustrates the case where the prescribed frequency is three.

The output signal M is one indicating that pulses having pulse widths longer than the prescribed pulse width, or the effective pulse width, are continuously input by the prescribed frequency. The output signal M is used as, for instance, an interrupt signal or a flag setting signal of a CPU. By the output signal M, the CPU can immediately recognize that pulses having pulse widths longer than the prescribed pulse width were continuously input by the prescribed frequency. If the input signal A indicates the state of on or off of a switch, the CPU can immediately recognize that the switch is surely depressed by the prescribed times.

Embodiment 8

Figure 15:
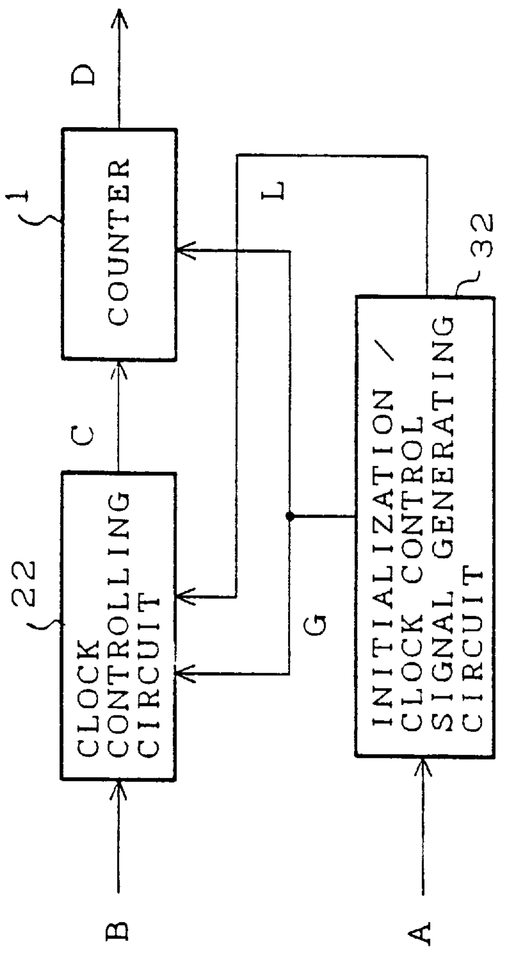
FIG. 15 is a block diagram showing the structure of a timer apparatus according to an eighth embodiment of the present invention.

FIG. 15 is a block diagram showing the structure of a timer apparatus according to the eighth embodiment (embodiment 8) of the present invention. In the figure, reference numeral 1 denotes a counter counting the number of pulses in a clock signal C. Reference numeral 22 denotes a clock controlling circuit beginning the passing of a clock signal B in response to an initialization signal G and stopping the passing of the clock signal B in response to a stop signal L. Reference numeral 32 denotes an initialization/clock control signal generating circuit generating the initialization signal G when a fall occurs in an input signal A.

Figures 16A, 16C, 16D, 16G, 16Q:
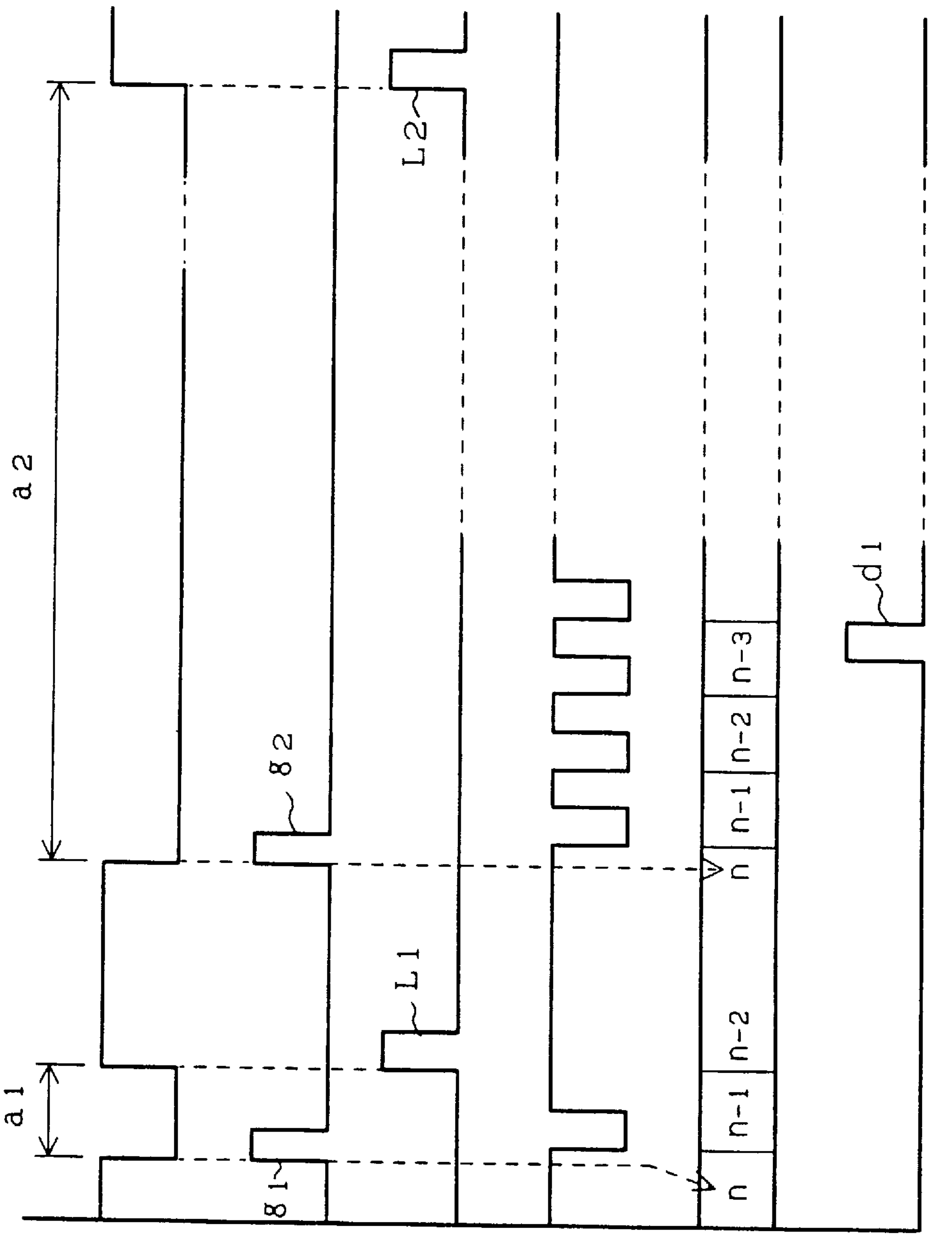
FIGS. 16(A), 16(G), 16(C), 16(Q), and 16(D) are timing charts showing an example of the wave forms of signals at respective parts of the timer apparatus shown in FIG. 15.
Figures 19A, 19C, 19D, 19Q:
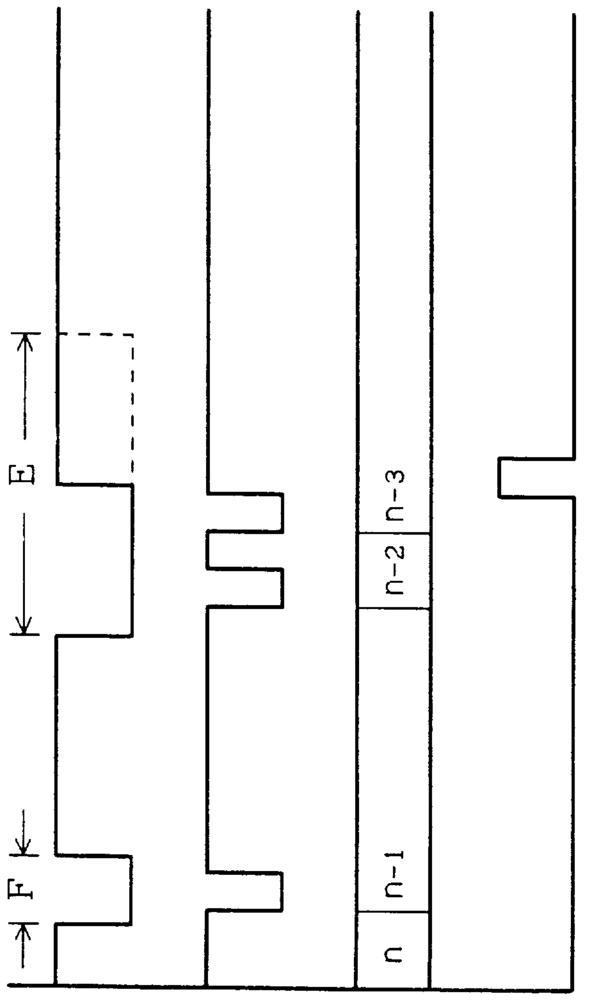
FIGS. 19(A), 19(C), 19(Q) and 19(D) are timing charts showing another example of the wave forms of signals at respective parts of the timer apparatus shown in FIG. 17.

Next, the operation thereof will be described. The clock signal B is always supplied to the clock controlling circuit 22. The initialization/clock control signal generating circuit 32 receives the input signal A and observes the occurrence of a rise and a fall in the input signal A. When a fall occurs in the input signal A, the initialization/clock control signal generating circuit 32 generates the initialization signal G. In FIG. 16(G), the initialization signal G is denoted by reference characters g1 and g2. The initialization signal G is supplied to the clock controlling circuit 22. When the clock controlling circuit 22 receives the initialization signal G, the circuit 22 outputs the clock signal B as the clock signal C. The initialization signal G is also supplied to the counter 1. The counter 1 is initialized by the input of the initialization signal G. The counter 1 counts the number of pulses in the clock signal C. Then, the counter 1 generates the count-up signal D when the count value underflows. In FIG. 16(D), the count-up signal D is denoted by a reference character d1.

When a rise occurs in the input signal A, the initialization/clock control signal generating circuit 32 generates the stop signal L. In FIG. 16(L), the stop signal L is denoted by reference characters L1 and L2. The stop signal L is supplied to the clock controlling circuit 22. The clock controlling circuit 22 stops the output of the clock signal C when the circuit 22 receives the stop signal L. Consequently, the count value of the counter 1 does not to change. Since the counter 1 is initialized in response to a fall in the input signal A, the counter 1 holds the count value thereof from the point of time of the end of the pulse having a pulse width a1 to the point of time of the beginning of the pulse having a pulse width a2. FIG. 16(Q) illustrates the state in which a count value (n−2) is held.

When the next fall appears in the input signal A, the initialization signal G is output from the initialization/clock control signal generating circuit 32. Consequently, the count value of the counter 1 is reset to the initial value n.

The count values of the counter 1 are supplied to a CPU, for instance. As described above, if a pulse having a pulse width shorter than the prescribed pulse width is input, the count value at the time of the end of the pulse is held in the counter 1. Then, the CPU can recognize the held count value. That is to say, the CPU can easily recognize the pulse width of an input pulse.

The examples using a down-counter as the counter 1 were shown in the respective embodiments described above, but an up-counter may be used as the counter 1. Also, all of the embodiments dealt the input signal A in which the low level of logic levels were significant, but an input signal A in which the high level of the logic levels are significant may be applicable. Furthermore, in each embodiment using the initialization circuit 3 generating the initialization signal G at the time of a rise of the input signal A, an initialization circuit 31 generating the initialization signal G at the time of a fall of the input signal A may be used instead of the initialization circuit 3. Moreover, in each embodiment using the initialization circuit 31 generating the initialization signal G at the time of a fall of the input signal A, an initialization circuit 3 generating the initialization signal G at the time of a rise of the input signal A may be used instead of the initialization circuit 31.

Although the descriptions were given to the advantages in the case where the outputs of the timer apparatus according to the respective embodiments described above were supplied to the CPU, the outputs of the respective timer apparatus can be supplied to various kinds of control apparatus. Moreover, the descriptions were given in the case where the information concerning the state of on or off of a switch was used as the input signal A. But the input signal A is not limited to the information concerning the state of on or off of a switch. Various kinds of detected information and the like can be employed as the input signal A.

As described above, according to the first aspect of the present invention, the timer apparatus is constructed to process a count-up signal of a counter by the effective pulse width controlling means as the information indicating an effective pulse width of an input signal, and consequently, there is obtained the advantage that it is prevented that a pulse having the effective pulse width is not misjudged to have been input though the pulse was not input actually, and the advantage that the count-up signal is not output after a period corresponding to the effective pulse width has passed, even if a pulse having a pulse width equal to the effective pulse width or more is input.

Furthermore, according to the second aspect of the present invention, the timer apparatus is constructed to process the first count-up signal during a period in which an input signal is significant as the information indicating the effective pulse width, and consequently, there is obtained the advantage that it is prevented that a pulse having the effective pulse width is misjudged to have been input though the pulse was not actually input, and the advantage that an outer control apparatus can immediately judge the input of a pulse having the effective pulse width.

Furthermore, according to the third aspect of the present invention, the timer apparatus is constructed so that a clock controlling circuit stops the output of clock signals when a count value of the counter takes one indicating a prescribed value, and consequently, there is obtained the advantage that it is prevented that a pulse having the effective pulse width is misjudged to have been input though the pulse was not actually input without adding any circuit element, and the advantage that a count-up signal is not output after a period corresponding to the effective pulse width has passed even if a pulse having a pulse width equal to the effective pulse width or more is input.

Furthermore, according to the fourth aspect of the present invention, the timer apparatus is constructed to count the frequency of the occurrence of a signal indicating the effective pulse width by a count-up frequency measuring circuit, there is obtained the advantage that it can immediately be detected whether or not pulses having pulse widths equal to the effective pulse width or more are input by a prescribed frequency.

Furthermore, according to the fifth aspect of the present invention, the timer apparatus is constructed to extract a count-up signal at a prescribed frequency of occurrence during a period in which an input signal is significant, and consequently, there is obtained the advantage that it is possible to detect an effective pulse width having an arbitrary width.

Furthermore, according to the sixth aspect of the present invention, the timer apparatus is constructed to include a one-shot pulse controlling circuit generating a one-shot pulse beginning at the time of the beginning of a significant period of an input signal and ending at the time of the end of the period or at the time of the generation of an output signal by the counter, and an effective pulse width detecting circuit extracting a count-up signal if the pulse width of the one-shot pulse is a prescribed value or more, and consequently, there is obtained the advantage that it is prevented that a pulse having the effective pulse width is misjudged to have been input though the pulse was not input actually without altering the clock controlling circuit from a conventional one, and the advantage that a count-up signal is not output after a period corresponding to the effective pulse width has passed even if a pulse having a pulse width equal to the effective pulse width or more is input.

Furthermore, according to the seventh aspect of the present invention, the timer apparatus is constructed to include a continuous pulse counting circuit counting the frequency of the output of a signal by the effective pulse width detecting circuit, and consequently, there is obtained the advantage that an outer control apparatus can immediately recognize that pulses having pulse widths equal to the effective pulse width or more continuously input by a prescribed frequency.

Furthermore, according to the eighth aspect of the present invention, the timer apparatus is constructed to include an initialization/clock control signal generating circuit initializing the counter thereof at the time of the beginning of a significant period of an input signal, and prohibiting the output of a clock signal by the clock controlling circuit thereof at the time of the occurrence of a count-up signal, and consequently, there is obtained the advantage that it is prevented that a pulse having the effective pulse width is misjudged to have been input though the pulse was not input actually, and the advantage that the pulse width of an input pulse can be easily recognized.

The preferred embodiments of the present invention were described above, but the descriptions are only for illustrations, and it should be interpreted so that deformations and changes of the above descriptions may be performed without departing from the spirit and the scope of the following claims.

What is claimed is:

1. A timer apparatus comprising:

a clock controlling circuit for outputting a clock signal during a period in which an input signal is significant;

a counter counting a number of pulses of the clock signal to generate a count-up signal when a count value thereof reaches a predetermined value; and an effective pulse width information controlling means for processing the count-up signal as information indicating an effective pulse width of the input signal.

2. The timer apparatus according to claim 1, wherein the effective pulse width information controlling means includes a signal controlling means for processing a first count-up signal during a period in which the input signal is significant as information indicating the effective pulse width.

3. The timer apparatus according to claim 2, wherein the signal controlling means includes said clock controlling circuit for stopping output of clock signals when said count value of the counter reaches said predetermined value.

4. The timer apparatus according to claim 3, further comprises a count-up frequency measuring circuit counting a frequency of occurrence of a signal indicating the effective pulse width.

5. The timer apparatus according to claim 1, wherein the effective pulse width information controlling means extracts a count-up signal at a predetermined frequency of occurrence during the period in which the input signal is significant.

6. The timer apparatus according to claim 2, wherein the signal controlling means includes a one-shot pulse controlling circuit generating a one-shot pulse beginning at a time of a beginning of a significant period of the input signal and ending at a time of an end of the period or at a time of generation of an output signal by the counter, and an effective pulse width detecting circuit extracting the count-up signal if a pulse width of the one-shot pulse is a predetermined value or more.

7. The timer apparatus according to claim 6, further comprises a continuous pulse counting circuit counting a frequency of the output of the effective pulse width detecting circuit.

8. A timer apparatus comprising:

a clock controlling circuit outputting a clock signal during a period in which an input signal is significant;

a counter counting a number of pulses of the clock signal to generate a count-up signal when a count value thereof reaches a predetermined value; and an initialization/clock control signal generating circuit initializing the counter at a time of a beginning of a significant period of the input signal, and prohibiting an output of the clock signal by the clock controlling circuit at a time of occurrence of the count-up signal.

* * * * *